(12) United States Patent
Liang

(10) Patent No.: US 7,803,722 B2
(45) Date of Patent: Sep. 28, 2010

(54) METHODS FOR FORMING A DIELECTRIC LAYER WITHIN TRENCHES

(75) Inventor: Jingmei Liang, Mountain View, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 11/876,657

(22) Filed: Oct. 22, 2007

(65) Prior Publication Data

US 2009/0104790 A1 Apr. 23, 2009

(51) Int. Cl.
*H01L 21/469* (2006.01)

(52) U.S. Cl. .................. 438/787; 438/788; 438/792; 257/E21.487

(58) Field of Classification Search ............... 438/787, 438/785, 788, 771, 792
See application file for complete search history.

(56) References Cited

U.S. PATENT DOCUMENTS

| 4,147,571 | A | 4/1979 | Stringfellow et al. |
| 4,816,098 | A | 3/1989 | Davis et al. |
| 4,818,326 | A | 4/1989 | Liu et al. |
| 4,931,354 | A | 6/1990 | Wakino et al. |
| 5,016,332 | A | 5/1991 | Reichelderfer et al. |
| 5,110,407 | A | 5/1992 | Ono et al. |
| 5,426,076 | A | 6/1995 | Moghadam |
| 5,558,717 | A | 9/1996 | Zhao et al. |
| 5,587,014 | A | 12/1996 | Leychika et al. |
| 5,622,784 | A | 4/1997 | Okaue et al. |
| 5,635,409 | A | 6/1997 | Moslehi |
| 5,786,263 | A | 7/1998 | Perera |
| 5,853,607 | A | 12/1998 | Zhao et al. |
| 5,937,308 | A | 8/1999 | Gardner et al. |
| 5,937,323 | A | 8/1999 | Orczyk et al. |
| 6,009,830 | A | 1/2000 | Li et al. |
| 6,024,044 | A | 2/2000 | Law et al. |
| 6,087,243 | A | 7/2000 | Wang |
| 6,090,723 | A | 7/2000 | Thakur et al. |
| 6,140,242 | A | 10/2000 | Oh et al. |
| 6,146,970 | A | 11/2000 | Witek et al. |
| 6,156,581 | A | 12/2000 | Vaudo et al. |

(Continued)

FOREIGN PATENT DOCUMENTS

DE 19654737 A1 7/1997

(Continued)

OTHER PUBLICATIONS

Gulleri, G. et al., "Deposition Temperature Determination of HDPCVD Silicon Dioxide Films," 2005, Microelectronic Engineering, vol. 82, pp. 236-241.

(Continued)

*Primary Examiner*—Zandra Smith
*Assistant Examiner*—Lawrence Tynes, Jr.
(74) *Attorney, Agent, or Firm*—Townsend and Townsend and Crew LLP

(57) ABSTRACT

A method for forming a semiconductor structure includes reacting a silicon precursor and an atomic oxygen or nitrogen precursor at a processing temperature of about 150° C. or less to form a silicon oxide or silicon-nitrogen containing layer over a substrate. The silicon oxide or silicon-nitrogen containing layer is ultra-violet (UV) cured within an oxygen-containing environment.

11 Claims, 7 Drawing Sheets

U.S. PATENT DOCUMENTS

| | | | |
|---|---|---|---|
| 6,165,834 A * | 12/2000 | Agarwal et al. | 438/240 |
| 6,207,587 B1 | 3/2001 | Li et al. | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,566,278 B1 | 5/2003 | Harvey et al. | |
| 6,596,654 B1 | 7/2003 | Bayman et al. | |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,867,086 B1 | 3/2005 | Chen et al. | |
| 6,890,403 B2 | 5/2005 | Cheung | |
| 6,900,067 B2 | 5/2005 | Kobayashi et al. | |
| 6,955,836 B2 | 10/2005 | Kumagi et al. | |
| 6,958,112 B2 | 10/2005 | Karim et al. | |
| 7,018,902 B2 | 3/2006 | Visoday et al. | |
| 7,084,076 B2 | 8/2006 | Park et al. | |
| 7,115,419 B2 | 10/2006 | Suzuki | |
| 7,148,155 B1 | 12/2006 | Tarafdar et al. | |
| 7,205,248 B2 | 4/2007 | Li et al. | |
| 7,220,461 B2 | 5/2007 | Hasebe et al. | |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,498,273 B2 | 3/2009 | Mallick et al. | |
| 7,524,735 B1 | 4/2009 | Gauri et al. | |
| 7,541,297 B2 | 6/2009 | Mallick et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakus et al. | |
| 2003/0232495 A1 | 12/2003 | Moghadam et al. | |
| 2004/0008334 A1 | 1/2004 | Sreenivasan et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0181555 A1 | 8/2005 | Haukka et al. | |
| 2005/0186731 A1 * | 8/2005 | Derderian et al. | 438/253 |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Curie | |
| 2006/0014399 A1 | 1/2006 | Joe | |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1 | 7/2007 | Weber | |
| 2007/0181966 A1 | 8/2007 | Watatani et al. | |
| 2007/0232082 A1 | 10/2007 | Balseanu et al. | |
| 2007/0281495 A1 * | 12/2007 | Mallick et al. | 438/778 |
| 2007/0281496 A1 | 12/2007 | Ingle et al. | |
| 2008/0085607 A1 * | 4/2008 | Yu et al. | 438/758 |
| 2008/0102223 A1 | 5/2008 | Wagner et al. | |
| 2009/0061647 A1 | 3/2009 | Mallick et al. | |

FOREIGN PATENT DOCUMENTS

| | | |
|---|---|---|
| EP | 1717848 A | 11/2006 |
| JP | 01241826 A | 9/1989 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

PCT International Search Report and Written Opinion mailed Jan. 6, 2009, International Application No. PCT/US08/82365, 12 pages.

Coltrin, M.E., et al., "Chemistry of AlGaN Particulate Formation," National Nuclear Security Administration, Physical, Chemical, & Nano Sciences, Research Briefs, 2005, pp. 42-43.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

International Search Report PCT/US07/71804.

EP Search Report mailed Jun. 9, 2009; Application No. 08167338.6, 9 pages.

Tsu, D. V. et al., "Silicon Nitride and Silicon Diimide Grown By Remote Plasma Enhanced Chemical Vapor Deposition", Journal of Vacuum Science and Technology: Part A, AVS/AIP, Melville, NY; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Depostion of silicon dioxide and silicon nitride by remote plasma enhanced chemical vapor deposition," Journal of Vacuum Science & Technology, vol. 4, No. 3, May-Jun. 1986, pp. 681-688.

PCT International Search Report and Written Opinion mailed on Jul. 30, 2008 by the European Patent Office, International Application No. PCT/US2007/081139, 19 pages.

PCT International Seach Report and Written Opinion mailed Apr. 12, 2010; International Application No. PCT/US2009/055073, 12 pages.

* cited by examiner

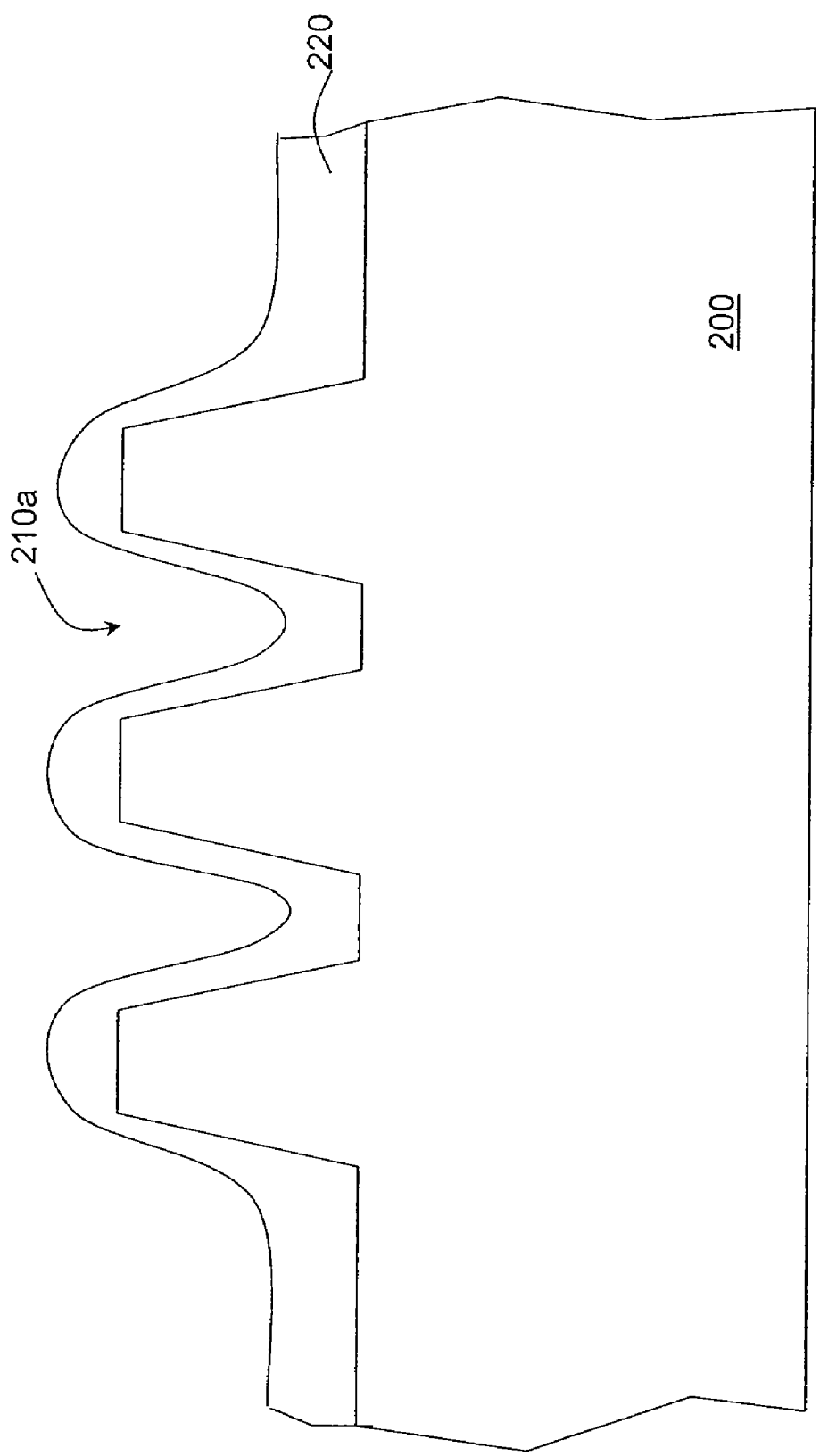

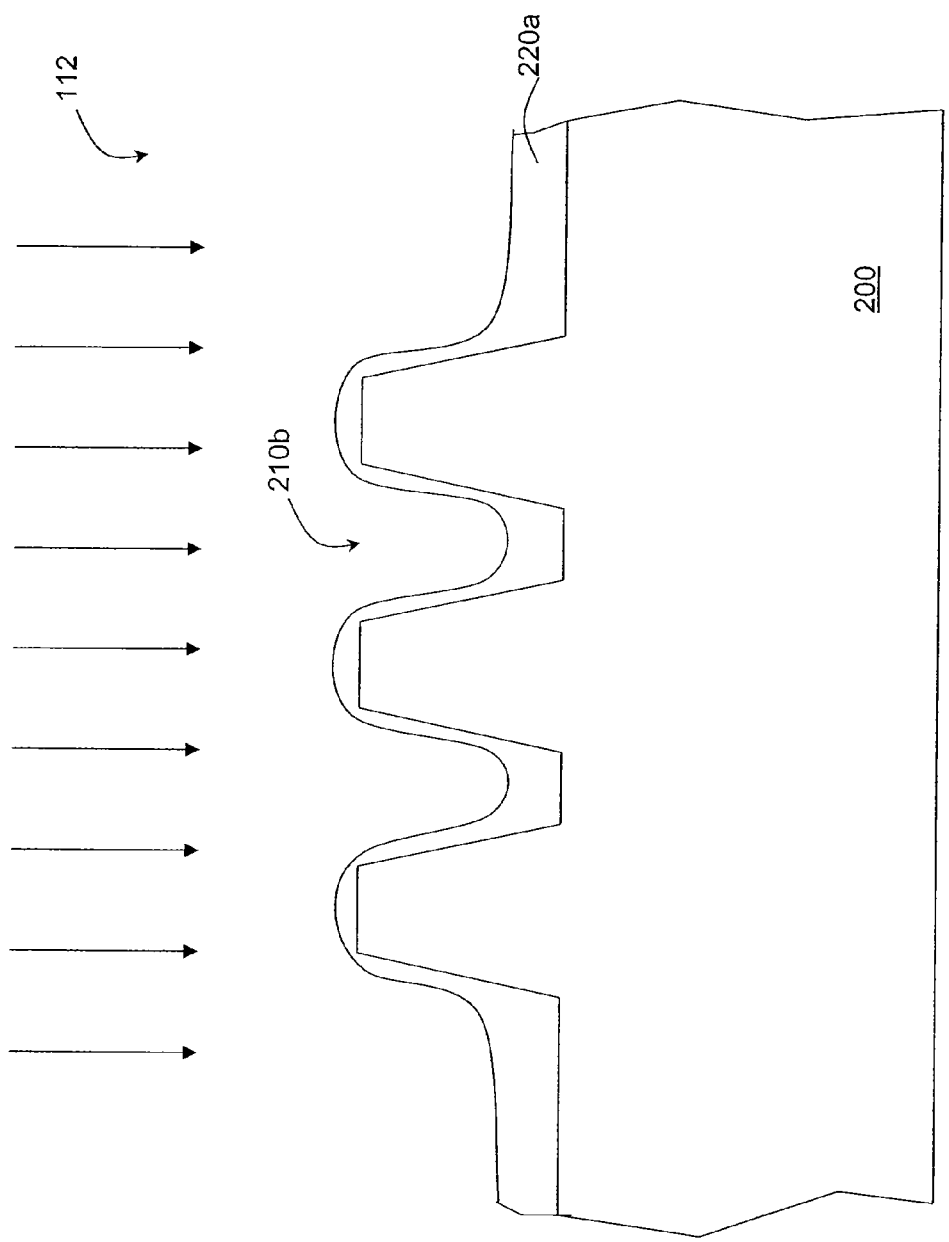

METHODS FOR FORMING A DIELECTRIC LAYER WITHIN TRENCHES

CROSS-REFERENCES TO RELATED APPLICATIONS

This application is related to a co-assigned U.S. Patent Application and titled "CHEMICAL VAPOR DEPOSITION OF HIGH QUALITY FLOW-LIKE SILICON DIOXIDE USING A SILICON CONTAINING PRECURSOR AND ATOMIC OXYGEN." This application is also related to a co-assigned U.S. patent application Ser. No. 11/754,924 by Lubomirsky et al., filed May 29, 2007, and titled "PROCESS CHAMBER FOR DIELECTRIC GAPFILL." The application is further related to a co-assigned U.S. Patent Application and titled "HIGH QUALITY SILICON OXIDE FILMS BY REMOTE PLASMA CVD FROM DISILANE PRECURSORS." The entire contents of the related applications are hereby incorporated by reference for all purposes.

BACKGROUND OF THE INVENTION

The present invention relates in general to methods for forming semiconductor structures, and more particular to methods for forming a dielectric layer within trenches.

As the device density on integrated circuits continues to increase, the size and distance between device structures continue to decrease. The narrower widths in the gaps of the structures and the trenches between structures increases the ratio of height to width (i.e., the aspect ratio) in these formations. The continued miniaturization of integrated circuit elements is shrinking the horizontal width within and between these elements faster than their vertical height.

While the ability to make device structures with ever increasing aspect ratios has allowed more of the structures (e.g., transistors, capacitors, diodes, etc.) to be packed onto the same surface area of a semiconductor chip substrate, it has also created fabrication problems. One of these problems is the difficulty of completely filling the gaps and trenches in these structures without creating a void or seam during the filling process. Filling gaps and trenches with dielectric materials like silicon oxide is necessary to electrically isolate nearby device structures from each other. If the gaps were left empty, there would be too much electrical noise, and current leakage for the devices to operate properly (or at all).

When gap widths are larger (and aspect ratios smaller), the gaps are relatively easy to fill with a rapid deposit of a dielectric material. The deposition material would blanket the sides and bottom of the gap and continue to fill from the bottom up until the crevice or trench was fully filled. As aspect ratios increased however, it became more difficult to fill the deep, narrow trench without having a blockage start a void or seam in the fill volume.

Voids and seams in a dielectric layer create problems both during semiconductor device fabrication and in the finished devices. The voids and seams are formed randomly in the dielectric layer and have unpredictable sizes, shapes, locations and population densities. This results in unpredictable and inconsistent post-deposition processing of the layer, such as even etching, polishing, annealing, etc. The voids and seams in the finished devices also create variations in the dielectric qualities of gaps and trenches in device structures. This can result in uneven and inferior device performance due to electrical crosstalk, charge leakage, and even shorting within and between device elements.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce the degree to which the deposited material builds up at the top or middle of the trench and eventually seals off the top of a void. However, slowing the deposition rate means increasing the deposition time, which reduces processing efficiency and production rates.

Another technique to control void formation is to increase the flowability of the deposited dielectric material. A material with more flowability can fill the trenches quickly from bottom up, and this desirably prevents void or seam formation that would become a permanent defect in the fill volume. Increasing the flowability of a silicon oxide dielectric material often involves adding water vapor or peroxide (e.g., $H_2O_2$) to the mix of precursors used to form the oxide layer. The water vapor creates more Si—OH bonds in the deposited film which impart an increased flowability to the film. However, increasing the moisture level during a silicon oxide deposition can also adversely effect the properties of the deposited film, including its density (i.e., an increased wet etch rate ratio (WERR)) and dielectric properties (i.e., an increased k-value).

BRIEF SUMMARY OF THE INVENTION

According to an exemplary embodiment, a method for forming a semiconductor structure includes reacting a silicon precursor and an atomic oxygen precursor at a processing temperature of about 150° C. or less to form a silicon oxide layer over a substrate. The silicon oxide layer is ultra-violet (UV) cured within an oxygen-containing environment.

According to another exemplary embodiment, the method further includes forming at least one trench structure within the substrate, wherein the at least one trench structure has a height to width aspect ratio of about 5:1 or more.

According to the other exemplary embodiment, the method further includes providing the substrate to a deposition chamber; generating the atomic oxygen precursor outside the deposition chamber; introducing the atomic oxygen precursor into the chamber; and introducing the silicon precursor to the deposition chamber, wherein the silicon precursor and the atomic oxygen precursor are mixed in the deposition chamber.

According to alternative exemplary embodiment, the generating the atomic oxygen precursor includes: forming a plasma from a gas mixture comprising argon; and introducing an oxygen precursor to the plasma, wherein the oxygen precursor dissociates to form the atomic oxygen. The oxygen precursor may be selected from the group consisting of molecular oxygen, ozone, and nitrogen dioxide.

According to an exemplary embodiment, the silicon precursor is selected from the group consisting of silane, dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane.

According to another exemplary embodiment, UV curing the silicon oxide layer has a processing temperature between about 20° C. and about 650° C.

According to the other exemplary embodiment, oxygen-containing environment comprises a mixture of ozone and oxygen.

According to alternative exemplary embodiment, the ozone has a percentage of about 18 wt % or less.

According to an exemplary embodiment, UV curing the silicon oxide layer has a processing time between about 1 minute and about 10 minutes.

According to alternative exemplary embodiment, UV curing the silicon oxide layer has an UV wavelength between about 200 nanometer (nm) and about 450 nm.

According to another exemplary embodiment, a method for forming a semiconductor structure includes interacting a silicon-containing precursor with at least one radical nitrogen precursor at a processing temperature of about 150° C. or less to form a silicon-nitrogen containing layer over a substrate, the silicon-containing precursor comprising two silicon atoms. The silicon-nitrogen containing layer is UV cured within an oxygen-containing environment to form a silicon oxide layer.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature of some exemplary embodiments may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIGS. 2A-2D are schematic cross-sectional views showing an exemplary method for forming a shallow trench isolation (STI) structure.

DETAILED DESCRIPTION OF THE INVENTION

Exemplary methods are described for forming a silicon oxide layer having a desired film density, a carbon concentration and/or a wet etch rate ratio (WERR) after a UV curing within an oxygen-containing environment. The UV curing may desirably increase the density of the silicon oxide layer and/or reduce the wet etch rate ratio of the silicon oxide layer.

Some exemplary methods include reacting a silicon precursor and an atomic oxygen precursor at a processing temperature of about 150° C. or less to form a silicon oxide layer over a substrate. The silicon oxide layer is ultra-violet (UV) cured within an oxygen-containing environment. Other exemplary methods include interacting a silicon-containing precursor with at least one radical nitrogen precursor at a processing temperature of about 150° C. or less to form a silicon-nitrogen containing layer over a substrate. The silicon-containing precursor may also comprise two or more silicon atoms. The silicon-nitrogen containing layer is UV cured within an oxygen-containing environment to form a silicon oxide layer.

Figure 1:
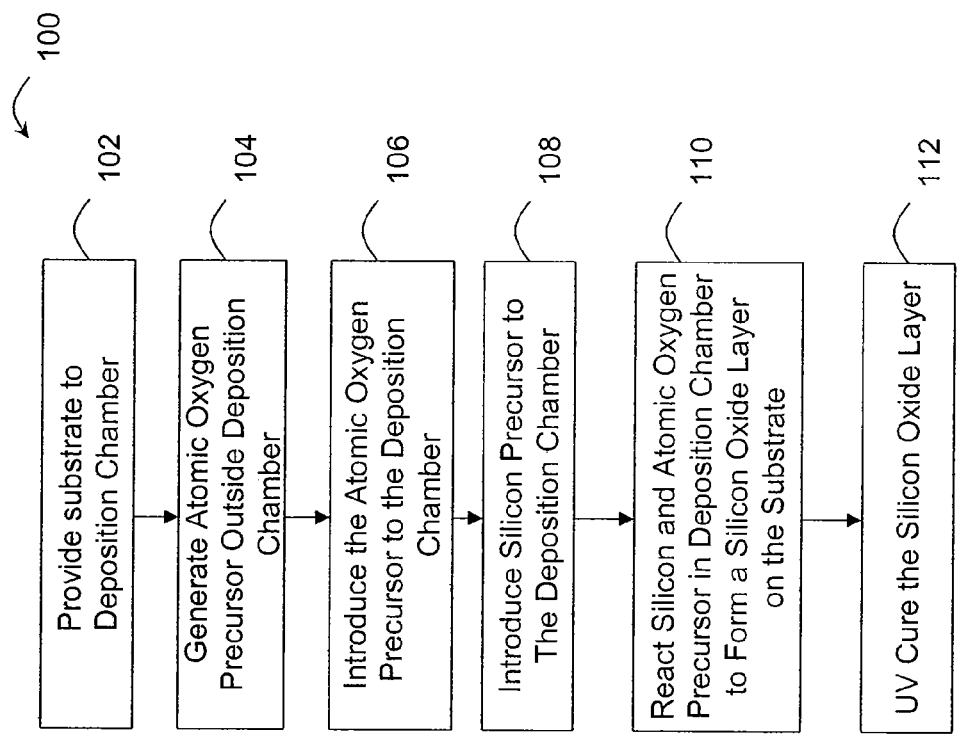
FIG. 1 is a flowchart showing an exemplary method for forming a silicon oxide layer over a substrate.

FIG. 1 is a flowchart showing an exemplary method for forming a silicon oxide layer over a substrate. In FIG. 1, a method 100 for forming a silicon oxide layer over a substrate may include processes 102-112, for example.

Figure 2A:
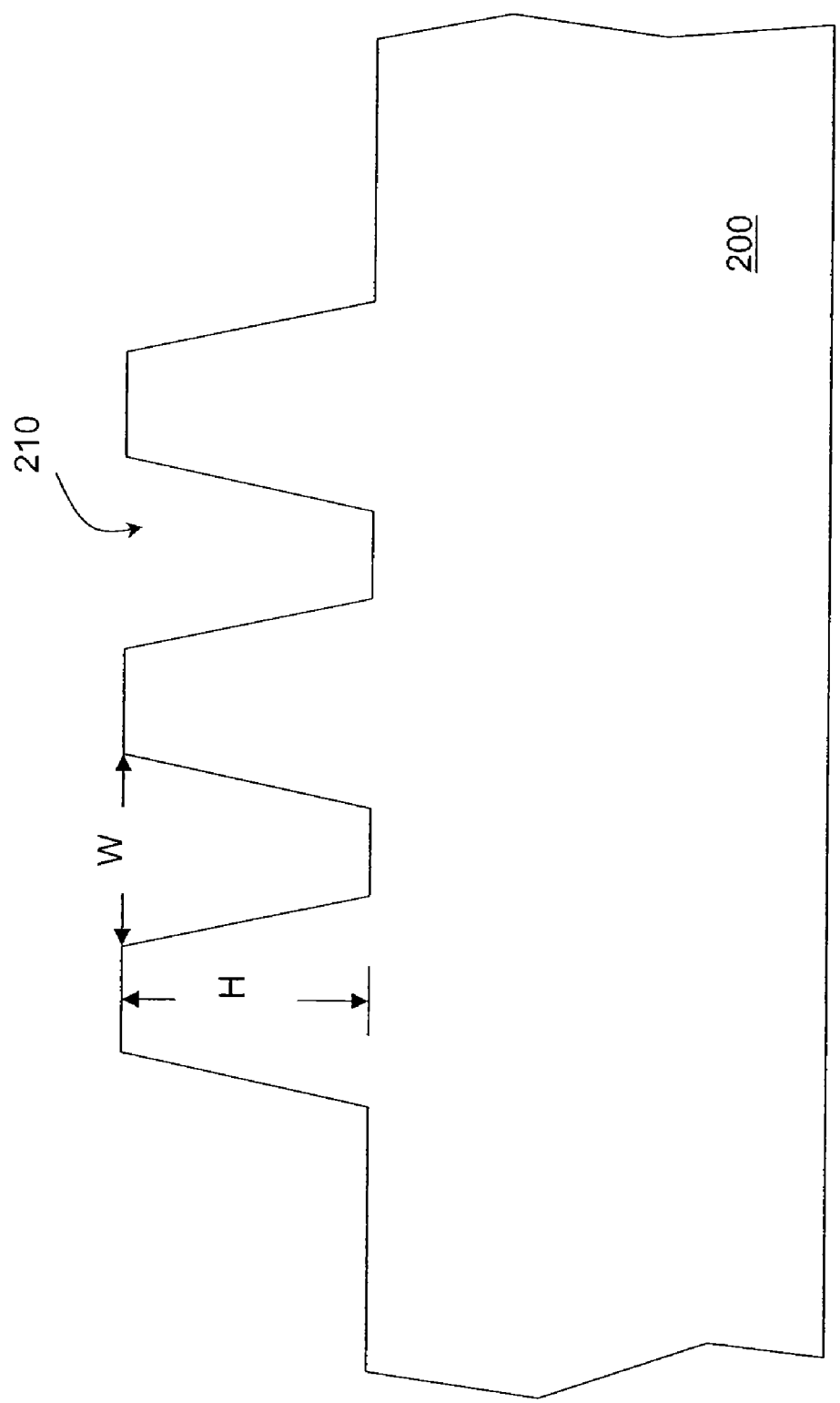

Process 102 provides a substrate such as substrate 200 (shown in FIG. 2A) to a deposition chamber. The substrate 200 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrate 200 may include at least one structure, such as trench structure, well, junction, diode, transistor, metal-oxide-semiconductor field effect transistor (MOSFET), inter-layer dielectric (ILD) structure, inter-metal dielectric (IMD) structure, circuit, other semiconductor structure or various combinations thereof. The substrate 200 may be a semiconductor wafer (e.g., a 200 mm, 300 mm, 400 mm, etc. silicon wafer). In some embodiments, the substrate 200 may have at least one trench such as trenches 210 formed therein as shown in FIG. 2A.

In some embodiments, process 104 may generate an atomic oxygen precursor outside the deposition chamber. The atomic oxygen precursor may be generated by, for example, the dissociation of an oxygen containing precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

In some embodiments, the dissociation of the oxygen containing precursor to generate the atomic oxygen precursor may be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

Referring again to FIG. 1, process 106 may introduce the atomic oxygen plasma to the deposition chamber where it may mix for the first time with a silicon precursor, which is introduced to the deposition chamber by process 108. In process 110, the highly reactive atomic oxygen precursor may react with the silicon precursor (and/or other deposition precursors that may be present in the deposition chamber) at moderate temperatures (e.g., processing temperatures of about 150° C. or less) to form a silicon oxide layer 220 as shown in FIG. 2B. In some embodiments, the processing temperature for forming the silicon oxide layer 220 may be between about −10° C. and about 150° C. The formation of the silicon oxide layer 220 may reduce dimensions of the trenches 210 to the dimensions of the trenches 210a. In some embodiments, the process 110 may have pressures between about 0.5 Torr and about 6 Torr total chamber pressure.

The silicon precursor may include an organosilane compound and/or silicon compound that does not substantially contain carbon. Silicon precursors without carbon may include silane ($SiH_4$), among others. Organosilane compounds may include compounds with direct Si—C bonding and/or compounds with Si—O—C bonding. Examples of organosilane silicon precursors may include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, among others.

In some embodiments, the silicon precursor may be mixed with a carrier gas before or during its introduction to the deposition chamber. A carrier gas may be an inactive gas that does not substantially interfere with the formation of the oxide film on the substrate. Examples of carrier gases include helium, neon, argon, and hydrogen ($H_2$), among other gases. Details about forming the silicon oxide layer 220 may be described in a co-assigned U.S. Patent Application, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", the entire contents of which are hereby incorporated by reference for all purposes.

In some embodiments, the atomic oxygen precursors and silicon precursors are not mixed before being introduced to the deposition chamber. The precursors may enter the chamber through spatially separated precursor inlets distributed around the deposition chamber. For example, the atomic oxygen precursor may enter from an inlet (or inlets) at the top of the deposition chamber and configured directly above the substrate. The inlet directs the flow of the atomic oxygen precursor in a direction substantially perpendicular to the substrate deposition surface. In other embodiments, the silicon precursor may enter from one or more inlets around the sides of the deposition chamber. The inlets may direct the flow of the silicon precursor in a direction approximately parallel to the deposition surface.

Additional embodiments include sending the atomic oxygen precursors and silicon precursors through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. patent application Ser. No. 11/754,924 by Lubomirsky et al, filed May 29, 2007, and titled "PROCESS CHAMBER FOR DIELECTRIC GAPFILL", the entire contents of which are hereby incorporated by reference for all purposes.

As the atomic oxygen precursors and silicon precursors react in the deposition chamber, they form the silicon oxide layer over the substrate. The initial oxide layer has desirably flowability, and may quickly migrate into gaps, openings, trenches, voids, seams, etc., in the structures present at the deposition surface. This allows the method 100 to provide oxide fills that are substantially free of voids and seams in gaps, trenches, and other surface structures. In some embodiments, the trenches 210 formed within the substrate 200 may have high height to width aspect ratios "H/W" (e.g., ARs of about 5:1, 6:1, 6:1, 8:1, 9:1, 10:1, 11:1, and 12:1 or more) as shown in FIG. 2A.

While not wishing to be bound to a particular theory, the silicon precursors and the atomic oxygen precursors may react to form a silicon oxide that has a high concentration of silicon-hydroxyl group (Si—OH) bonds. These bonds may impart the increased flowability to the silicon oxide layer. The initial silicon oxide layer may contain a level of carbon therein. The Si—OH bonds and/or carbon may increase the wet etch rate ratio (WERR) and dielectric constant of the deposited layer, which can reduce the quality of the deposited oxide, and its effectiveness as a electrical insulator.

Referring again to FIG. 1, process 112 may UV cure the silicon oxide layer formed by the process 110 in an oxygen-containing environment. The oxygen-containing environment may include a mixture of oxygen ($O_2$) and ozone ($O_3$). In some embodiments, ozone within the mixture may have a percentage of about 18 wt % or less. In other embodiments, the ozone within the mixture may be about 12 wt %. The process 112 may have a processing temperature between about 20° C. and about 650° C. In some embodiments, the process 112 may have a processing time between about 1 minute and about 10 minutes. In one embodiment, the processing time is about 10 minutes. The UV curing may uses an UV wavelength between about 200 nanometer (nm) and about 450 nm. In some embodiments, the UV curing may be carried out in a NanoCure™ UV twin chamber of a Producer SE™ mainframe, available from Applied Materials, based in Santa Clara, Calif.

The process 112 may densify the silicon oxide layer 220 to the silicon oxide layer 220a as shown in FIG. 2C. The process 112 may reduce the concentration of the Si—OH bonds and/or the concentration of carbon within the silicon oxide layer 220. Some experiments are carried out and their results are shown in Tables 1 and 2.

TABLE 1

|  | Precursor A | | | | Precursor B | | |
| --- | --- | --- | --- | --- | --- | --- | --- |
|  | As-dep | 390° C. $N_2$ | 390° C. UV-Ar | 390° C. UV-$O_3$ | As-dep | 390° C. UV-Ar | 390° C. UV-$O_3$ |
| Density (g/cc) | 1.7939 | 1.7759 | 1.7115 | 1.9600 | 1.4912 | 1.3424 | 2.0022 |
| Carbon (%) | 1.4 | 1.24 | 0.84 | 0 | 6.6 | 4.0 | 0 |
| Post anneal WERR (100:1 DHF) | 35 | 7.0 | 15.9 | 5.8 | >30 | 29 | 5.0 |

In Table I, two silicon oxide layers are formed with different carbon concentrations using precursors A or B by, for example, the processes 100-110 described above in conjunction with FIG. 1. The silicon oxide layer formed using precursor B has a level of carbon higher than that of the precursor A. The silicon oxide layers indicated by "precursor A" are subjected to different curings such as nitrogen ($N_2$) curing, UV-Ar curing and UV-$O_3$ curing at a processing temperature of about 390° C. It is found that the carbon concentration is reduced from about 1.4 (As-dep.) to substantially near to 0 (UV-$O_3$). The density (1.7939 g/cc) of the as-deposited silicon oxide layer is increased to about 1.9600 g/cc post UV-$O_3$ curing. These oxide layers are then annealed in N2 environment at around 900° C. The post anneal wet etch rate ratio (WERR) of the oxide layer is reduced from about 35 (without any curing) to about 5.8 (post UV-$O_3$ curing).

For the precursor B with a higher carbon level than the precursor A, it is found that the carbon concentration of the oxide layer is reduced from 6.6 (As-dep.) to substantially close to 0 (post UV-$O_3$). The density (1.4912 g/cc) of the as-deposited silicon oxide layer is increased to about 2.0022 g/cc post UV-$O_3$ curing. The post anneal wet etch rate ratio (WERR) is reduced from more than 30 (As-dep. without any curing) to about 5.0 (with UV-O3 curing). Accordingly, the UV-$O_3$ curing may densify the as-deposited silicon oxide layer and desirably reduce the post anneal WERR of the silicon oxide layer.

According to Table 1, it is also found that the UV-$O_3$ cured silicon oxide layer has a higher density than that of the UV-Ar cured silicon oxide layer or that of the $N_2$ cured silicon oxide layer. The UV-$O_3$ cured silicon oxide layer has a lower post anneal WERR than that of the UV-Ar cured silicon oxide layer or that of the $N_2$ cured silicon oxide layer.

TABLE 2

|  | Precursor A | | | | Precursor B | | | | |
| --- | --- | --- | --- | --- | --- | --- | --- | --- | --- |
|  | 100° C. | 300° C. | 390° C. | 500° C. | 100° C. | 200° C. | 300° C. | 400° C. | 500° C. |
| Density (g/cc) | 1.9794 | 1.9792 | 1.9600 | 2.0342 | 1.9683 | 1.9794 | 1.9600 | 2.0022 | 1.9731 |
| Carbon (%) | 0 | 0 | 0 | 0 | 1.1 | 0 | 0 | 0 | 0 |
| Post anneal WERR (100:1 DHF) | 6.1 | 6.4 | 5.8 | 4.7 | 2.5 | 3.0 | 4.4 | 5.0 | 4.5 |

In Table 2, the silicon oxide layers indicated with "Precursor A" are subjected to UV-$O_3$ curing at different temperatures, e.g., 100° C., 300° C., 390° C. and 500° C.; and the silicon oxide layers indicated with "Precursor B" are subjected to UV-$O_3$ curing at different temperatures, e.g., 100° C., 200° C., 300° C., 400° C. and 500° C. It is found that the UV-$O_3$ curing may achieve desired density and post anneal WERR of the silicon oxide layers at low processing temperature of about 100° C.

Figure 2D:
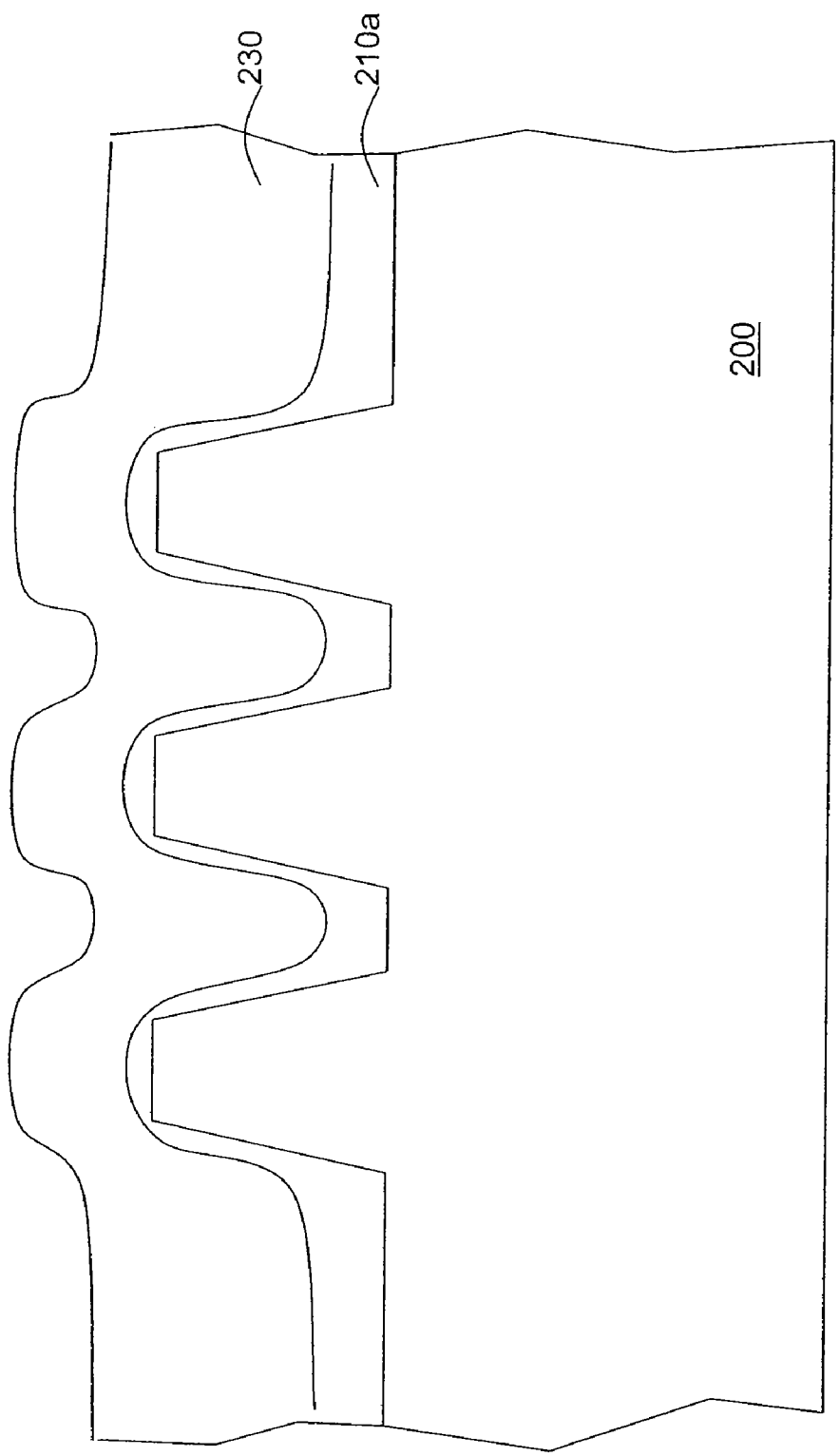

FIG. 2D is a cross-sectional view showing an exemplary STI structure. In FIG. 2D, a dielectric layer 230 such as a high density plasma chemical vapor deposition (HDP CVD) layer is formed over the cured silicon oxide layer 220a. Since the cured silicon oxide layer 220a has a thickness at the bottom region of the trenches 210 larger than that on the sidewalls of the trenches 210, the aspect ratio of the trenches 210a may be desirably reduced. Accordingly, the dielectric layer 230 may be formed and filled within the trenches 210a without substantially forming seams, gaps or voids within the dielectric layer 230.

In some embodiments, the dielectric layer 230 may be subjected to a thermal treatment such as an anneal process (not shown). The thermal treatment may desirably densify the dielectric layer 230. In other embodiments, the processes for forming the dielectric layer 230 and the thermal treatment may be optional. The silicon oxide layer 220 (shown in FIG. 2B) may be formed and substantially fill the trenches 210.

Figure 3:
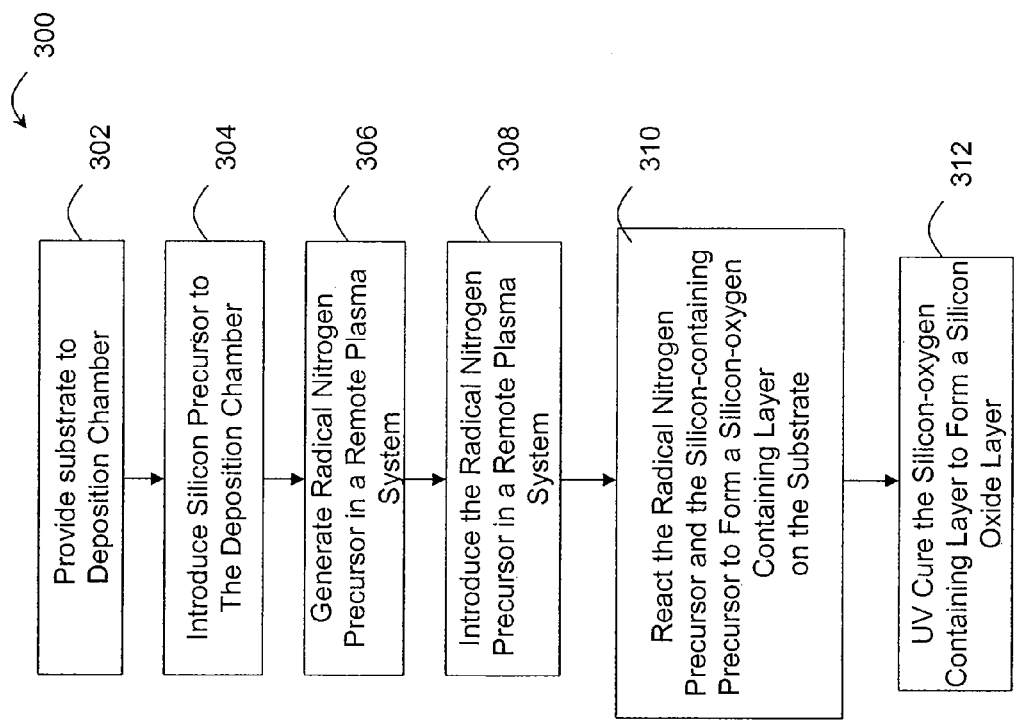
FIG. 3 is a simplified flow chart illustrating an exemplary method for forming a silicon oxide film over a substrate.

FIG. 3 is a simplified flow chart illustrating another exemplary method for forming a silicon oxide film over a substrate. In FIG. 3, the method 300 may utilize the chemical reaction process described below in connection to FIG. 4 to form a silicon oxide film. Exemplary method 300 may include a non-exhaustive series of steps to which additional steps (not shown) may also be added. One of ordinary skill in the art would recognize many variations, modifications, and alternatives. In some embodiments, the method 300 may include providing a substrate in a deposition chamber (302); and introducing one or more silicon containing precursors with at least a Si—Si bond in their molecular framework into the deposition chamber (304). The method 300 may include generating one or more radical nitrogen precursors (306). For example, the one or more radical nitrogen precursors may be generated in a remote ammonia plasma system coupled to the deposition chamber.

The method 300 may include introducing the one or more radical nitrogen precursors into the deposition chamber (308). The method 300 may react one or more radical nitrogen precursors and the one or more silicon containing precursors (310) to form a flowable dielectric film with Si—N(H)—Si bonds on the substrate. In some embodiments, the process 310 may have a processing temperature of about 150° C. or less.

In some embodiment, the one or more silicon containing precursors used in the CVD process include multiple hydroxyl groups in their molecular frameworks. The hydroxyl groups are retained in the CVD-deposited film providing a flow-like characteristic of the film that is similar to that of conventional SOG (Spin-on-Glass) film. Because of the flow-like characteristic, the CVD-deposited film based on method 300 tends to be collected in the bottom portion of substrate gap or trench during the deposition, reducing the occurrence of voids around the center of the gapfill or STI trench. In another embodiment, the one or more silicon containing precursors with at least a Si—Si bond in their molecular frameworks include disilane and/or polysilane precursors. The disilanes have a single Si—Si unit in their molecular framework while the polysilanes may have multiple Si—Si bonds. For example, disilanes with different substituents can be used, including alkoxy disilanes, alkoxy-alkyl disilanes, and alkoxy-acetoxy disilanes. In additional examples, disilanes with higher homologues may also be used. Of course, one of skilled in the art would recognize many alternatives, variations, and modifications in the selection of di- and polysilane precursors.

In some embodiments, reactive nitrogen species (such as —N, —NH, and —$NH_2$) used in method 300 may be generated by introducing ammonia ($NH_3$) in a remote plasma system. The remote plasma system may include a separate chamber that is coupled to the deposition chamber. The decomposition of ammonia in the remote plasma system produces radical nitrogen precursors, such as hydronitrene radicals like NH or $NH_2$. Atomic hydrogen (H) radicals may also be generated. For example, hydronitrene and hydrogen radicals are generated in process 306 of the method 300. The radical nitrogen precursors may then be transferred to the deposition chamber where the one or more silicon containing precursors have been independently introduced. For example, the reactive nitrogen precursor may be transferred through a showerhead, while the silicon precursor is introduced through a plurality of fluted nozzles. Details about forming the silicon-oxygen containing layer may be described in a co-assigned U.S. Patent Application, and titled "HIGH QUALITY SILICON OXIDE FILMS BY REMOTE PLASMA CVD FROM DISILANE PRECURSORS", the entire contents of which are hereby incorporated by reference for all purposes.

After the formation of the silicon-oxygen containing layer, the method 300 may include UV curing (312) the CVD-deposited flowable dielectric film into a silicon oxide film within an oxygen-containing environment. The UV curing (312) may include a film expansion due to the conversion of Si—N(H)—Si bonds to Si—O—Si bonds that counteracts a film shrinkage due to the removal of some hydroxyl groups from the CVD-deposited film. As a result, the balance of the film expansion and shrinkage leads to a dense, void-free silicon oxide film that also has a reduced probability of cracking due to stresses being introduced during the deposition and anneal.

In some embodiments, the UV curing (312) may be similar to the UV curing (112) described above in conjunction with FIG. 1. The processes described in conjunction with FIG. 2D may cooperate with the method 300 shown in FIG. 3. One of ordinary skill in the art may modify the process flow to achieve a desired semiconductor structure.

Figure 4:
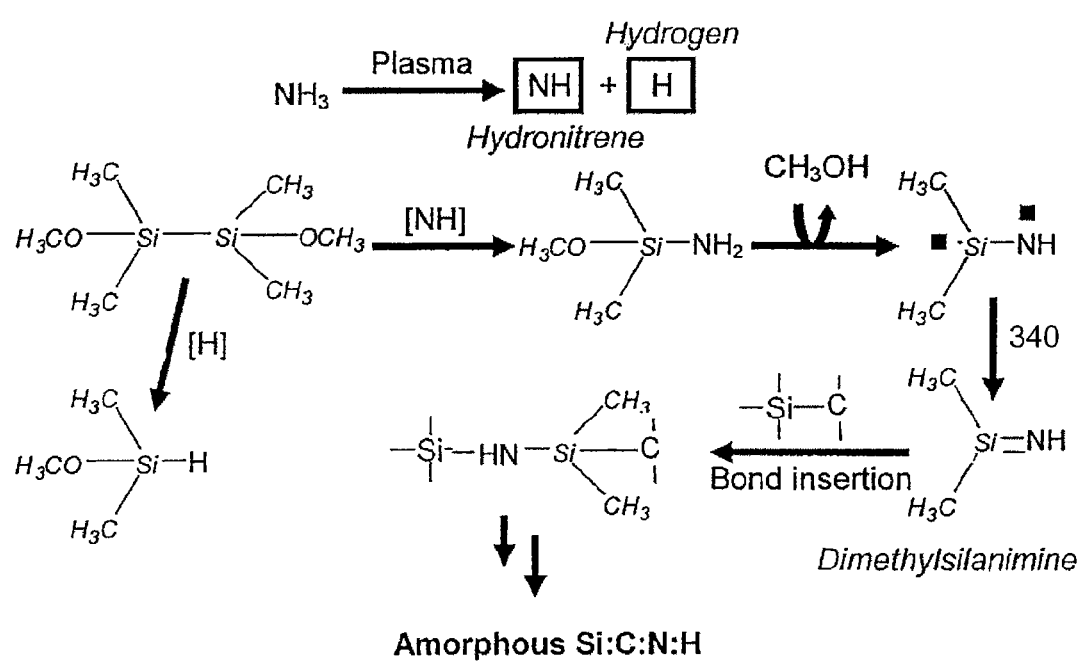
FIG. 4 is a configuration shows an exemplary chemical reaction process of conversion of Si—Si bonds in a silicon precursor to Si—N(H)—Si bonds then expansively into Si—O—Si bonds.

FIG. 4 is a configuration schematically showing an exemplary chemical reaction process of conversion of Si—Si bonds in a silicon precursor to Si—N(H)—Si bonds then expansively into Si—O—Si bonds. This diagram is merely an example, which should not unduly limit the scope of the claims herein. One of ordinary skill in the art would recognize other variations, modifications, and alternatives. As shown, the chemical reaction is a CVD (Chemical Vapor Deposition) process during which a silicon containing precursor with at least one Si—Si bond is mixed with a radical nitrogen species generated from the decomposition of ammonia in a remote plasma (i.e., a plasma formed separately from the deposition of the flowable Si—N(H)—Si film). The CVD process leads to conversion of Si—Si bonds in the silicon precursor (or precursors) to Si—N(H)—Si bonds. The Si—N(H)—Si bonds are then converted to Si—O—Si bonds during a subsequent UV-O$_3$ curing, where the annealing may be done in, for example, an oxygen-containing (e.g., a mixture of oxygen and ozone) environment.

In some embodiments, the CVD process includes introducing at least two reactants independently into a deposition chamber and letting them react at a pre-determined condition. In one embodiment, a first reactant can be one type of precursor selected from a group consisting of Alkoxy Disilanes, Alkoxy-Alkyl Disilanes, Alkoxy-Acetoxy Disilanes, and Polysilanes. For example, the Alkoxy Disilanes include $Si_2(EtO)_6$ Ethoxy Disilanes, $Si_2(MeO)_6$ Methoxy Disilanes, and $Si_6(MeO)_{12}$ Methoxy Cyclohexylsilanes, where Et denotes Ethyl group ($C_2H_6$) and Me denotes Methyl group ($CH_3$). In another example, the Alkoxy-Alkyl Disilanes may include $Si_2(EtO)_4(Me)_2$ Tetraethoxy-Dimethyl Disilanes, $Si_2(EtO)_4(Et)_2$ Tetraethoxy-Diethyl Disilanes, $Si_2(EtO)_2(Me)_4$ Diethoxy-Tetramethyl Disilanes, $Si_2(MeO)_4(Me)_2$ Tetramethoxy-Dimethyl Disilanes, and $Si_4O_2(Me)_8$ Methyl Cyclohexylsiloxanes, $Si_6(MeO)_6(Me)_6$ Methoxy-Methyl Cyclohexylsilanes, $Si_4O_2(H_2)_4$ Hydro-Cyclohexylsiloxanes. In yet another example, the Alkoxy-Acetoxy Disilanes may include $Si_2(AcO)_6$ Acetoxy Disilanes, $Si_2(Me)_4(AcO)_2$ Tetramethyl-Diacetoxy Disilanes, and $Si_2(Me)_2(AcO)_4$ Dimethyl-Tetracetoxy Disilanes, where Ac denotes Acetyl group. And in yet still another example, the polysilanes includes cyclopentylsilanes or other subinstitutes. Either one of these precursors mentioned above may be supplied into the deposition chamber without meeting any of the other reactant for the CVD process.

In other embodiments, the other reactant for the CVD process may be a second reactant including radical nitrogen species generated from remote ammonia plasma. For example, the radical nitrogen species may include nitrogen ions, hydronitrene radicals $NH_x$, where x=1, or 2. Because in the molecular frameworks of those Disilane or Polysilane based precursors there is at least a Si—Si bond which is highly reactive, the CVD process may result in a product containing a plurality of Si—N(H)—Si bonds in addition to hydroxyl groups and carbon-based species. For example, the product is a silicon carbonitride film deposited on the substrate. The CVD-desposited silicon carbonitride film is amorphous and flowable due to the existence of those hydroxyl groups and carbon-based species.

In some embodiments, the subsequent UV-O$_3$ curing within an oxygen-containing environment induces another chemical reaction between the silicon carbonitride film and oxygen (O). This reaction is an oxidization process in which the Si—N(H)—Si bond in the silicon carbonitride film is converted into Si—O—Si bond, resulting a formation of an silicon oxide film. One side product may include NH$_3$ ammonia which can be immediately pumped out through an exhaust system built for the chamber.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

As used herein and in the appended claims, the singular forms "a", "and", and "the" include plural referents unless the context clearly dictates otherwise. Thus, for example, reference to "a process" may includes a plurality of such processes and reference to "the nozzle" may include reference to one or more nozzles and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method for forming a semiconductor structure, comprising:
    reacting a silicon precursor and an atomic oxygen precursor at a processing temperature of about 150° C. or less to form a silicon oxide layer over a substrate; and
    UV-O$_3$ curing the silicon oxide layer within an ozone containing environment.

2. The method of claim 1 further comprising forming at least one trench structure within the substrate, wherein the at least one trench structure has a height to width aspect ratio of about 5:1 or more.

3. The method of claim 1 further comprising:
    providing the substrate to a deposition chamber;
    generating the atomic oxygen precursor outside the deposition chamber;

introducing the atomic oxygen precursor into the chamber; and introducing the silicon precursor to the deposition chamber, wherein the silicon precursor and the atomic oxygen precursor are mixed in the deposition chamber.

4. The method of claim 3, wherein generating the atomic oxygen precursor comprises:

forming a plasma from a gas mixture comprising argon; and introducing an oxygen precursor to the plasma, wherein the oxygen precursor dissociates to form the atomic oxygen.

5. The method of claim 4, wherein the oxygen precursor is selected from the group consisting of molecular oxygen, ozone, and nitrogen dioxide.

6. The method of claim 1, wherein the silicon precursor is selected from the group consisting of silane, dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane.

7. The method of claim 1, wherein UV-$O_3$ curing the silicon oxide layer has a processing temperature between about 20° C. and about 650° C.

8. The method of claim 1, wherein the ozone containing environment comprises a mixture of ozone and oxygen.

9. The method of claim 8, wherein the ozone has a percentage of about 18% or less.

10. The method of claim 1, wherein UV-$O_3$ curing the silicon oxide layer has a processing time between about 1 minute and about 10 minutes.

11. The method of claim 1, wherein UV-$O_3$ curing the silicon oxide layer has an UV wavelength between about 200 nanometer (nm) and about 450 nm.

* * * * *